US010763066B2

United States Patent
Bauer et al.

(10) Patent No.: US 10,763,066 B2
(45) Date of Patent: Sep. 1, 2020

(54) SWITCH CELL HAVING A SEMICONDUCTOR SWITCH ELEMENT AND MICRO-ELECTROMECHANICAL SWITCH ELEMENT

(71) Applicant: Siemens Aktiengesellschaft, Munich (DE)

(72) Inventors: Anne Bauer, Fürth (DE); Werner Hartmann, Weisendorf (DE); Holger Schönherr, Feucht (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/324,445

(22) PCT Filed: Jul. 18, 2017

(86) PCT No.: PCT/EP2017/068075
§ 371 (c)(1),
(2) Date: Feb. 8, 2019

(87) PCT Pub. No.: WO2018/028947
PCT Pub. Date: Feb. 15, 2018

(65) Prior Publication Data
US 2019/0172672 A1    Jun. 6, 2019

(30) Foreign Application Priority Data

Aug. 11, 2016 (DE) .................. 10 2016 215 001

(51) Int. Cl.
*H01H 59/00* (2006.01)
*H01H 9/54* (2006.01)
(Continued)

(52) U.S. Cl.
CPC ........ *H01H 59/0009* (2013.01); *H01H 9/542* (2013.01); *H01H 89/00* (2013.01); *H03K 17/687* (2013.01); *H01H 2071/008* (2013.01)

(58) Field of Classification Search
CPC .......................... H01H 59/0009; H01H 9/542
See application file for complete search history.

(56) References Cited

U.S. PATENT DOCUMENTS

| 6,831,542 B2 * | 12/2004 | Volant | H03K 17/965 |
| | | | 336/115 |
| 7,737,810 B2 * | 6/2010 | Chan | H01H 9/542 |
| | | | 200/181 |

(Continued)

FOREIGN PATENT DOCUMENTS

| CN | 102906846 A | 1/2013 | ............ H01H 47/00 |
| DE | 198 50 397 A1 | 5/2000 | ............... H01H 1/00 |

(Continued)

OTHER PUBLICATIONS

Chinese Office Action, Application No. 201780049184.2, 21 pages, dated Jul. 29, 2019.

(Continued)

*Primary Examiner* — Kyung S Lee
(74) *Attorney, Agent, or Firm* — Slayden Grubert Beard PLLC

(57) ABSTRACT

Various embodiments include a switch cell comprising: a semiconductor switch element; a micro-electromechanical switch element; and an electronic actuation circuit. The semiconductor switch element and the micro-electromechanical switch element are connected in parallel. In a switch-off process for the switch cell, the semiconductor switch element is switched off after the micro-electromechanical switch element is switched off.

11 Claims, 4 Drawing Sheets

(51) Int. Cl.
  *H01H 89/00*   (2006.01)
  *H03K 17/687*  (2006.01)
  *H01H 71/00*   (2006.01)

(56) References Cited

U.S. PATENT DOCUMENTS

| | | | |
|---|---|---|---|
| 8,154,365 B2* | 4/2012 | Chan | H01H 9/542 |
| | | | 200/181 |
| 8,928,435 B2 | 1/2015 | Despont et al. | 335/78 |
| 10,033,179 B2 | 7/2018 | Fitzgerald et al. | |
| 2005/0104621 A1 | 5/2005 | Kawahara et al. | 326/39 |
| 2006/0269186 A1* | 11/2006 | Frame | H03H 7/24 |
| | | | 385/12 |
| 2007/0009202 A1* | 1/2007 | Chan | H01H 9/542 |
| | | | 385/18 |
| 2007/0116406 A1* | 5/2007 | Yonezawa | B81B 3/0086 |
| | | | 385/18 |
| 2007/0139145 A1* | 6/2007 | Subramanian | H01H 59/0009 |
| | | | 335/78 |
| 2009/0161277 A1* | 6/2009 | Roesner | H02H 7/1227 |
| | | | 361/87 |
| 2009/0272634 A1 | 11/2009 | Ehlers et al. | 200/181 |
| 2010/0014199 A1 | 1/2010 | Kawa et al. | 361/56 |
| 2010/0254062 A1 | 10/2010 | Chan et al. | 361/211 |
| 2011/0227666 A1* | 9/2011 | Manssen | H03H 5/12 |
| | | | 333/32 |
| 2016/0006241 A1* | 1/2016 | Fitzgerald | H02H 9/04 |
| | | | 361/13 |

FOREIGN PATENT DOCUMENTS

| | | | | |
|---|---|---|---|---|
| DE | 10 2015 110 467 A1 | 1/2016 | | B81B 7/02 |
| EP | 1 930 922 A2 | 6/2008 | | H01H 1/00 |
| EP | 2 056 315 A2 | 5/2009 | | H01H 9/54 |
| EP | 2 337 043 A1 | 6/2011 | | H01H 1/00 |
| EP | 2 541 568 A1 | 1/2013 | | H01H 1/00 |
| EP | 1 995 744 B1 | 3/2014 | | H01H 1/00 |
| WO | 2018/028947 A1 | 2/2018 | | H01H 59/00 |

OTHER PUBLICATIONS

German Office Action, Application No. 10 2016 215 001.4, 10 pages, dated May 5, 2017.
International Search Report and Written Opinion, Application No. PCT/EP2017/068075, 21 pages, dated Oct. 18, 2017.
Yu, Cungui et al., "Rocket and Missile Launch Technology Progress," Book Excerpt, Beijing University of Aeronautics and Astronautics Press, p. 170 (4 pages total, Chinese language w/ English abstract), dated Oct. 1, 2015.
Chinese Rejection Decision, Application No. 201780049184.2, 16 pages, dated Jul. 2, 2020.

\* cited by examiner

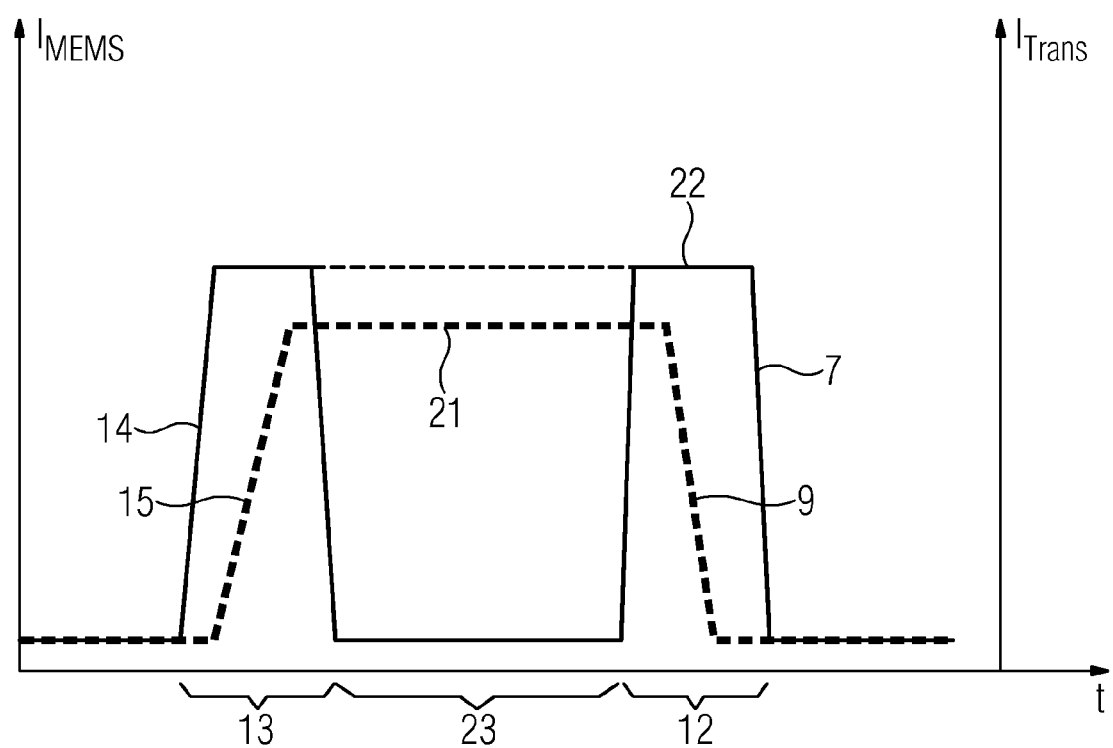

SWITCH CELL HAVING A SEMICONDUCTOR SWITCH ELEMENT AND MICRO-ELECTROMECHANICAL SWITCH ELEMENT

CROSS-REFERENCE TO RELATED APPLICATIONS

This application is a U.S. National Stage Application of International Application No. PCT/EP2017/068075 filed Jul. 18, 2017, which designates the United States of America, and claims priority to DE Application No. 10 2016 215 001.4 filed Aug. 11, 2016, the contents of which are hereby incorporated by reference in their entirety.

TECHNICAL FIELD

The present disclosure relates to switches. Various embodiments may include a switch cell having a semiconductor switch element and a micro-electromechanical switch element and a switching unit, an inverter, a switching device, and/or a method for operating a switching unit.

BACKGROUND

Micro-electromechanical systems, or here more specifically micro-electromechanical switch elements, referred to hereinafter as MEMSs, are a possible replacement for conventional circuit breakers in electric power distribution systems, particularly in the low-voltage range. Since a MEMS-type single switch element has microscopic dimensions, typically in the order of several 10 µm, the electric strength is limited to a typical range of 50-100 V. In addition, the current-carrying capacity of these MEMSs restricts the field of application to typically less than 100 mA. This means that, in practice, to enable higher currents to be switched when used as circuit breakers, it is necessary for a plurality of these MEMSs to be arranged electrically in parallel in a circuit.

Since, in low-voltage switching technology, it is also necessary to handle higher voltages in the 700 V to 1000 V range, it is also necessary for a corresponding number of MEMSs to be arranged electrically in series. Manufacturing tolerances and fluctuations in the switching process, for example different contact resistances or different switching times due to contact sticking, cause a different voltage and current distribution to prevail between switches. This in turn has the result that some elements can be overloaded, which is manifested, for example, as sticking of switching contacts or fusion if arcing occurs. This would greatly reduce the expected lifetime of the MEMS or the plurality of MEMSs.

SUMMARY

The teachings of the present disclosure describe a switch cell, which is in principle suitable to be used in a circuit breaker and is distinguished from the prior art in that the individual MEMS components contained therein have a higher lifetime. For example, some embodiments include a switch cell having a semiconductor switch element (6), a micro-electromechanical switch element (8) (MEMS), an electronic actuation circuit (10), wherein the semiconductor switch element (6) and the micro-electromechanical switch element (8) are connected in parallel and wherein, for a switch-off process (12) for the switch cell (2), the actuation circuit (10) is designed such that the semiconductor switch element (6) is switched off after the micro-electromechanical switch element (8) is switched off (9).

In some embodiments, for a switch-on process (13) for the switch cell (2), the semiconductor switch element is switched on (14) before the micro-electromechanical switch element (8) is switched on (13).

In some embodiments, the actuation circuit (10) comprises a time-delay element and/or a pulse-stretching element.

In some embodiments, the micro-electromechanical switch element (8) and the semiconductor switch element (6) are arranged jointly on a substrate (17).

In some embodiments, the micro-electromechanical switch element (8) and the semiconductor switch element (6) are integrated jointly on a silicon chip.

In some embodiments, a plurality of micro-electromechanical switch elements (8) are connected in parallel and in series to form an array and the array (16) is connected in parallel to the semiconductor switch element (6).

As another example, some embodiments include a switching unit comprising a plurality of switch cells (2) as described above.

In some embodiments, a plurality of switch cells (2) is connected in a row and in parallel.

As another example, some embodiments include an inverter comprising at least one switching unit (4) as described above.

As another example, some embodiments include a switching device for low-voltage or medium-voltage networks comprising at least one switching unit (4) as described above.

As another example, some embodiments include a method for operating a switch cell, wherein a semiconductor switch element (6) and a micro-electromechanical switch element (8) (MEMS) are connected in parallel and an electronic actuation circuit (10) is provided, wherein, during a switch-off process (12), the actuation circuit (10) switches off the semiconductor switch element (6) after the micro-electromechanical switch element (8).

In some embodiments, during a switch-on process (13) for the switch cell (2), the semiconductor switch element (6) is switched on before the micro-electromechanical switch element (8).

In some embodiments, the semiconductor switch element (6) is switched off between a switch-on process (13) and a switch-off process (12) for the switch cell (2).

BRIEF DESCRIPTION OF THE DRAWINGS

Various embodiments and further features are explained with reference to the following drawings. These are purely exemplary depictions and do not limit the scope of the disclosure. Herein, identical features with the same designations and different embodiments are given the same reference characters. The drawings show.

DETAILED DESCRIPTION

Figure 1:
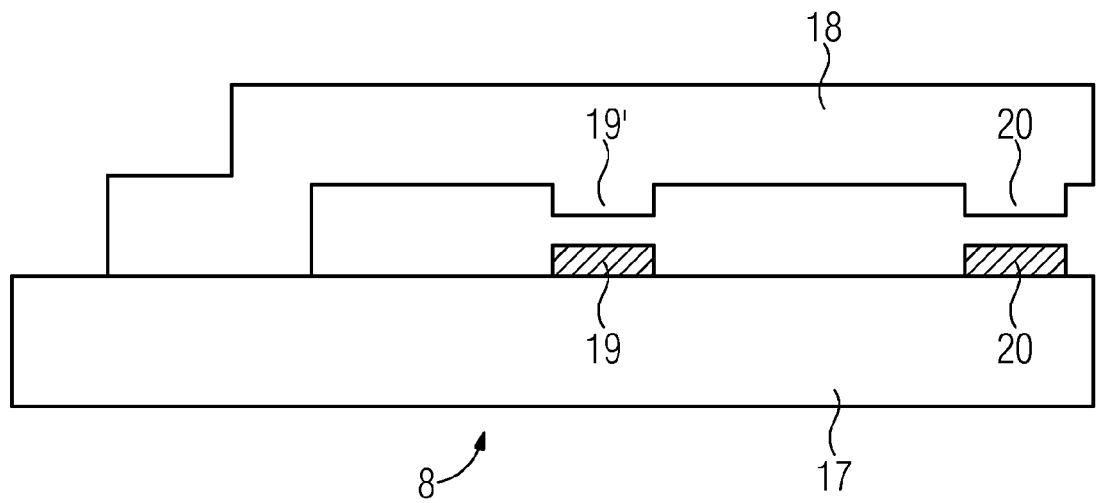
FIG. 1 a greatly enlarged cross-sectional view through a micro-electromechanical switch, FIG. 2 an equivalent circuit diagram of a switch cell with a semiconductor switch element and MEMS, FIG. 3 a switch cell with a plurality of MEMSs connected in a row and in series and a semiconductor switch element, FIG. 4 a switching unit with a plurality of switch cells connected in parallel and in a row, and FIG. 5 a depiction of the current profile relative to time during switch-on and switch-off of a switch cell.

Various embodiments include a switch cell comprising a semiconductor switch element, a micro-electromechanical switch element (MEMS), and an electronic actuation circuit. The semiconductor switch element and the MEMS are connected in parallel and, for a switch-off process for the switch cell, the actuation circuit is designed such that the semiconductor switch element is switched off after the MEMS is switched off. Herein, the term MEMS should be understood to mean a switch element produced with the means of microsystems technology. Herein, the term microsystems technology should be generally understood to mean technology that is able to produce microscopically small mechanically acting components, for example switches or toothed wheels that are able to perform a movement thereby in this context. Herein, as a rule, use is made of technology known from semiconductor electronics, wherein it is also possible to produce micro-electromechanical switches on substrates, as a rule silicon or gallium arsenide. Herein, the length of a MEMS is less than 1 mm, and in some cases less than 100 μm. Herein, the largest structural element of a MEMS should be understood to be the switch tongue of a MEMS-type switch element.

The described switch cell arrangement provides that the semiconductor switch element only has to carry current for a very short time, i.e. for a few microseconds, in particular for less than 50 μs in order in this way to reduce the load on the electromechanical contacts of the MEMS, in particular during the switch-off process. Herein, the switch-off process for the MEMS is particularly critical, since switching plasma such as sparks or arcs can occur during the switch-off process. However, in principle, it is also expedient to bypass the MEMS circuit by means of a semiconductor component during the switch-on process since the application of excessively high currents during the switch-on process can result in fusion on the MEMS.

In some embodiments, semiconductor switch elements are typically transistors, for example field-effect transistors, especially particularly low-resistance, low-loss MOSFETS (CoolFETs). Other embodiments are IGBTs and thyristor structures, in each case in an antiparallel arrangement in order to permit bipolar current flow, in particular in AC applications.

Semiconductor switch elements can be loaded much more highly for such a short time than is possible in continuous operation. Since, due to the smaller dimensions enabled thereby, they occupy less space, they can, if expedient for another reason, also be integrated directly on the silicon chip on which the MEMS structure is also provided. This avoids component scattering and minimizes parasitic elements, in particular line inductance and furthermore, optimizes the actual switching process.

A hybrid component of this kind has a considerable advantage over a pure circuit that is exclusively MEMS-driven. The circuit described also eliminates statistical fluctuations in the switching times when switching on and off since, during this critical, but temporally very short, phase, the semiconductor switches take over the current flow and hence switch the MEMS switching contacts at zero current and zero voltage. This in particular eliminates transient unequal distributions of currents and voltages that would otherwise occur due to different contact resistances and voltage drops. In particular, this suppresses the formation of switching plasma when switching on and switching off and hence can achieve a much higher lifetime for the MEMS contacts. In principle, it can be assumed that the arrangement described opens up the possibility of the large-scale use of MEMS in circuit breakers in practical application.

In some embodiments, the actuation circuit comprises a time-delay element and/or a pulse-stretching element. Depending upon the nature of the circuit for the actuation circuit and its connection to gate electrodes of the semiconductor switch element and the MEMS, to achieve the desired effect of switching the MEMS at zero current, it can be expedient either to have a time delay in the MEMS switching process on switch-on or pulse stretching in the circuit of the semiconductor switch element on switch-off.

In some embodiments, the semiconductor switch element can be arranged on the same substrate, in particular a silicon chip, on which the MEMS is also provided. This can achieve a high integration density, wherein, however, it is in principle possible to provide the semiconductor switch element on a separate chip mounted on the same substrate as the MEMS. In principle, however, the semiconductor switch can also be connected in parallel as a separate component. Herein, the integration of the semiconductor switch elements and possibly the gate drivers may reduce overall costs because packaging of microelectronics is a significant cost and space factor and can be reduced significantly in the manner described. This is also possible to a comparable extent if MEMS chips, driver chips and semiconductor chips are applied on a common substrate.

In some embodiments, for a plurality of MEMSs may be connected in parallel and in series to form an array and for the array in turn to be connected in parallel to the semiconductor switch element. Herein, a semiconductor switch element with larger dimensions could be equipped such that is connected in parallel to a plurality of MEMSs which are arranged in an array and are again connected in parallel and in series. Such an arrangement is also referred to as a switch cell. Accordingly, a switch cell also be designed such that one semiconductor switch supports a plurality of MEMSs, in both series connection and parallel connection or combinations thereof, with respect to the described switch-on and switch-off process.

In some embodiments, a switching unit comprises a plurality of switch cells, wherein once again the switch cells can be connected in series and in a row. The arrangement as a connection in series and in a row allows that overall a higher current or a higher voltage can be applied during the respective switch process. Therefore, for the voltages and currents that occur in low-voltage networks, a large number of corresponding switch cells may be connected in parallel in order to handle the currents required, which can be up to 500 A. In addition, technical means for handling the network voltage require the connection in a row of a plurality of the above-described parallel arrangements of switch cells. Hence, up to 500,000, possibly up to a million, individual elements may be required for a switching unit, which can in turn be installed in a switching device or even in an inverter. The respective number is determined by the type of application, the requirements, in particular the current intensity to be handled or switched and the voltage applied.

In some embodiments, both an inverter and a switching device for low-voltage or medium-voltage networks each comprise at least one switching unit as described above.

In some embodiments, a method for operating a switch cell, wherein a semiconductor switch element and a MEMS are connected in parallel and an electronic actuation circuit is provided, wherein, during a switch-off process, the actuation circuit switches off the semiconductor switch element after the MEMS in terms of time.

In some embodiments, during the switch-on process for the switch cell, the semiconductor switch element is switched on before the MEMS. Both cases again have the same advantage as that described above with respect to the corresponding apparatus, namely that the semiconductor switch element can be connected during switch-off, but maybe also during switch-on. Hence, it is possible during the actual switching process for current and voltage peaks to be intercepted by the temporarily more robust semiconductor switch element and, during this process, i.e. during switch-on and during switch-off, for the MEMS to be switched virtually at zero current. Thus, the advantages of the MEMS, which is able to carry higher currents and voltages for a longer time without undergoing extreme heating, and the advantages of the semiconductor switch element that is temporarily able to accept higher voltages and current without being destroyed thereby can be combined and hence extend the lifetime of the entire switch cell, i.e. a combination of the MEMS and the semiconductor switch element. This also enables applications of the switch cells in inverters and in switching devices for low-voltage networks.

FIG. 1 depicts a micro-electromechanical switch element, MEMS, 8 arranged on a substrate 17, wherein the substrate 17 comprises a silicon chip. The MEMS 8 furthermore comprises a switch tongue 18, which may be machined out of the substrate 17 by methods of semiconductor technology and microsystems technology. The substrate 17 is provided with a gate electrode 19, which can be actuated electronically, with a counter-electrode 19' arranged opposite thereto on the switch tongue 18, wherein the application of a voltage to the gate electrode 19 induces a movement of the switch tongue 18 toward the substrate 17 and the two switching contacts 20 are brought together resulting in an electric contact at the contacts 20. Then, the actual current flow is carried in the MEMS through the contacts 20.

Proceeding from this general description of a MEMS with respect to FIG. 1, there now follows a description of a switch cell 2 comprising a MEMS 8, as depicted by way of example in FIG. 1, and comprising a semiconductor switch element 6, wherein the semiconductor switch element 6 and the MEMS 8 are connected in parallel. The switch cell 2 further comprises an electronic actuation circuit 10, which, in this example, is in contact with a gate electrode 11 of the semiconductor switch element 6. The actuation circuit 10 is furthermore connected to the gate electrode 19 of the MEMS 8.

Herein, the actuation circuit 10 is designed such that, during a switch-off process for the switch cell 2 (see reference number 12 in FIG. 5), the semiconductor switch element 6 is always only switched off after the MEMS is switched off 8. The switch-off process 12 and also the switch-on process 13 for the switch cell 2 are illustrated in a current-time diagram in FIG. 5. Herein, the left y-axis indicates the current profile that takes place in the MEMS and denoted there on the axis by $I_{MEMS}$. The right y-axis indicates the current profile through the semiconductor component 6 which is denoted by $I_{trans}$. The x-axis shows the time profile. Hence, the curve 21 in the graph in FIG. 5 relates to the left y-axis $I_{MEMS}$, the group 22 relates to the right y-axis $I_{trans}$. As described above, FIG. 5 describes both the switch-on process 13 and the switch-off process 12 for the switch element 2. Herein, the switch-on process 13 comprises a switch-on process 14 for the semiconductor component 6 and a switch-on process 15 for the MEMS 8, wherein the switch-on process 15 is depicted herein by a dashed line. Similarly, also depicted in this regard is the switch-off process 7 for the semiconductor switch element 6 and the switch-off process 9 for the MEMS 8.

In some embodiments, the switch-off process 12 for the MEMS 8 takes place at zero current, since herein the risk of arcing occurring is particularly high and hence the risk of damage to the MEMS is particularly high. The actuation circuit 10 is, therefore, designed such that, during the switch-off process 12, the semiconductor switch element 6 is switched on before the MEMS is switched off and the current flow takes place through this semiconductor switch element 6. During the current flow through the semiconductor switch element 6, the MEMS is switched off, wherein herein, this switching off for the MEMS substantially takes place at zero current so that herein a flashover or sparking or generally plasma formation between the contacts 20 is avoided. The contacts 20 can be separated from one another cleanly and without material removal.

It is only after this separation process of the switches 20 has taken place, that the actuation circuit also switches off the semiconductor switch element 6, as depicted by the switch-off process 7 in the curve 22 in FIG. 5. Herein, the actuation circuit can include a time-delay element, which is connected to the gate electrode 11 of semiconductor switch element 6 and delays the switching-off thereof. Herein, the delay is within in the microsecond range, the delay may have time of less than 50 µs, or less than 10 µs. The same method is also applicable to the switch-on process 13, here, the actuation circuit actuates the semiconductor switch element such that it is already current-carrying before the MEMS 8 is connected and the switch-on process 15 for the MEMS 8, like the switch-off process 9, to a large extent takes place at zero current.

The switch curve 22, which illustrates the current flow $I_{trans}$ of the semiconductor switch element 2 in FIG. 5, can adopt two different profiles between the switch-on process 13 and the switch-off process 12, in principle, the semiconductor switch element can be switched off during the current-carrying phase 23 of the MEMS 8 in order to protect this components, but it can, in principle, also remain switched on, as illustrated by the dashed line in FIG. 22, since the greatest current-carrying load due to the low internal resistance during the time interval 23 flows through the MEMS 8 and so the semiconductor switch element 6 is hardly loaded at all.

Therefore, the circuit or current conduction of the two structural elements 6 and 8 connected in parallel described in FIG. 5 is expedient since, on the one hand, the MEMS 8 and the semiconductor switch element 6 have design-related advantages and disadvantages, which are compensated by the circuit described. On the one hand, the semiconductor switch element is suitable, temporarily, i.e. in the microsecond range, to withstand and switch higher currents than the mechanically acting MEMS structure. Therefore, the switch-off process, but also the switch-on process, may be performed by the described semiconductor switch element 6.

However, the semiconductor switch element 6 in continuous operation, has a strong temperature development thus necessitating complex cooling. This is where the advantage of the MEMS 8, which can carry comparatively high current without any greater thermal development, comes into play, since it has a lower internal resistance than the semiconductor switch element 6. This in turn has the result that, during continuous operation, i.e. during the current-carrying phase of the MEMS 23, it can be operated with very low heat development and hence high energy efficiency. Herein, it should be noted that, in practice, compared to the ranges 13 and 12, the range 23 is much longer than is shown in FIG. 5 for purposes of clarity.

Figure 2:
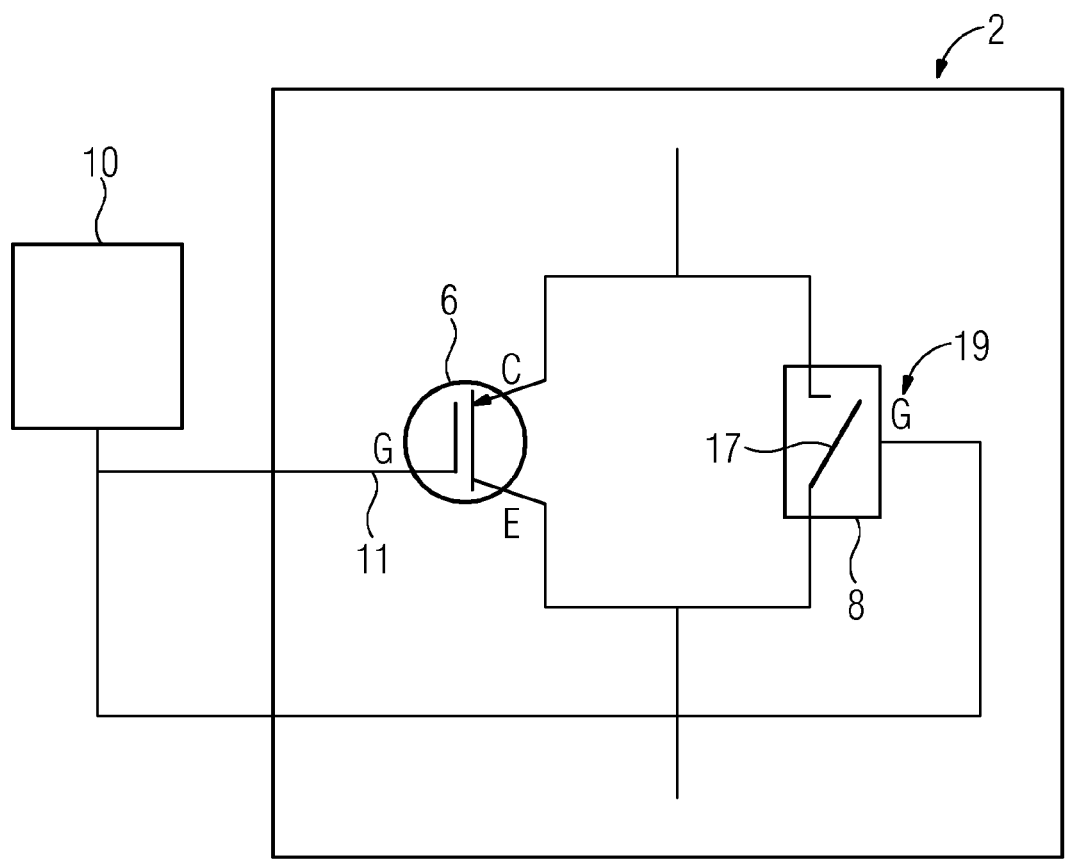
Figure 3:
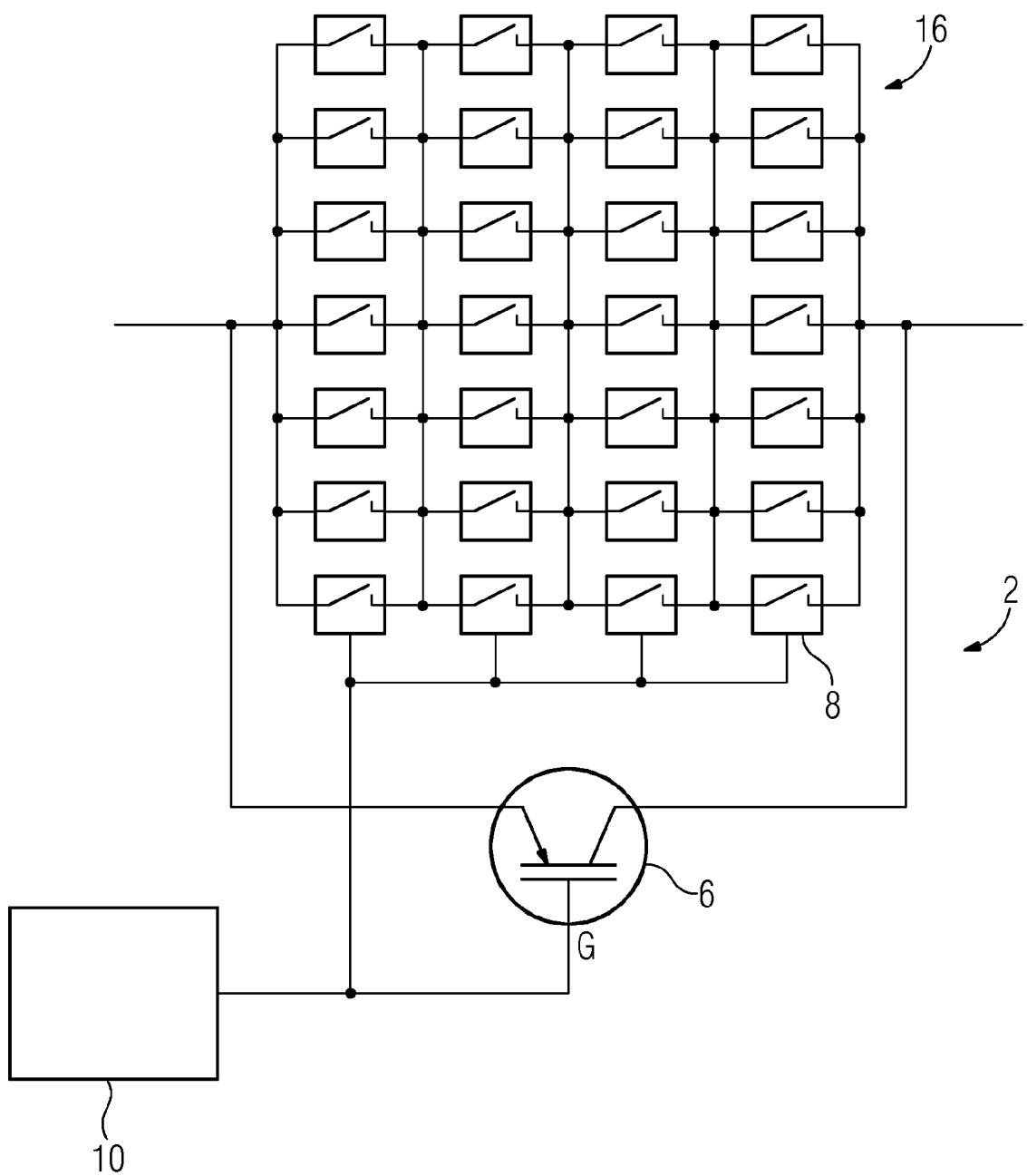

FIG. 3 depicts a switch cell 2 with a certain difference from the switch cell 2 in FIG. 2. Herein, once again a semiconductor switch element 6 is provided, but this is arranged in parallel to a plurality of MEMSs 8. Herein, a plurality of MEMSs 8 forms an array 16 comprising a connection in a row and connection in series of MEMSs 8. In practice, depending on the design, the number of MEMSs 8 used in the array 16 may be very high; several hundred thousand MEMSs 8 can be arranged on the substrate 17. Similarly to this, the switch cell 2 in FIG. 3 can also be provided with an actuation circuit 10, which actuates both the semiconductor switch element 6 and the individual MEMSs 8 in the array 16.

In some embodiments, the semiconductor switch element on the one hand and the actuation electronics 10 can be integrated or arranged on the same substrate 17. However, it is also possible, and, with some embodiments, expedient for the semiconductor switch element and/or the circuit 10, to be arranged as a separate chip on the common substrate. This is in turn a corresponding chip, for example a silicon chip or a gallium arsenide chip. Depending upon the performance class or application, it is also possible to select a variant with which the semiconductor switch element is in principle arranged remotely from the MEMS 8 on a separate chip.

Figure 4:
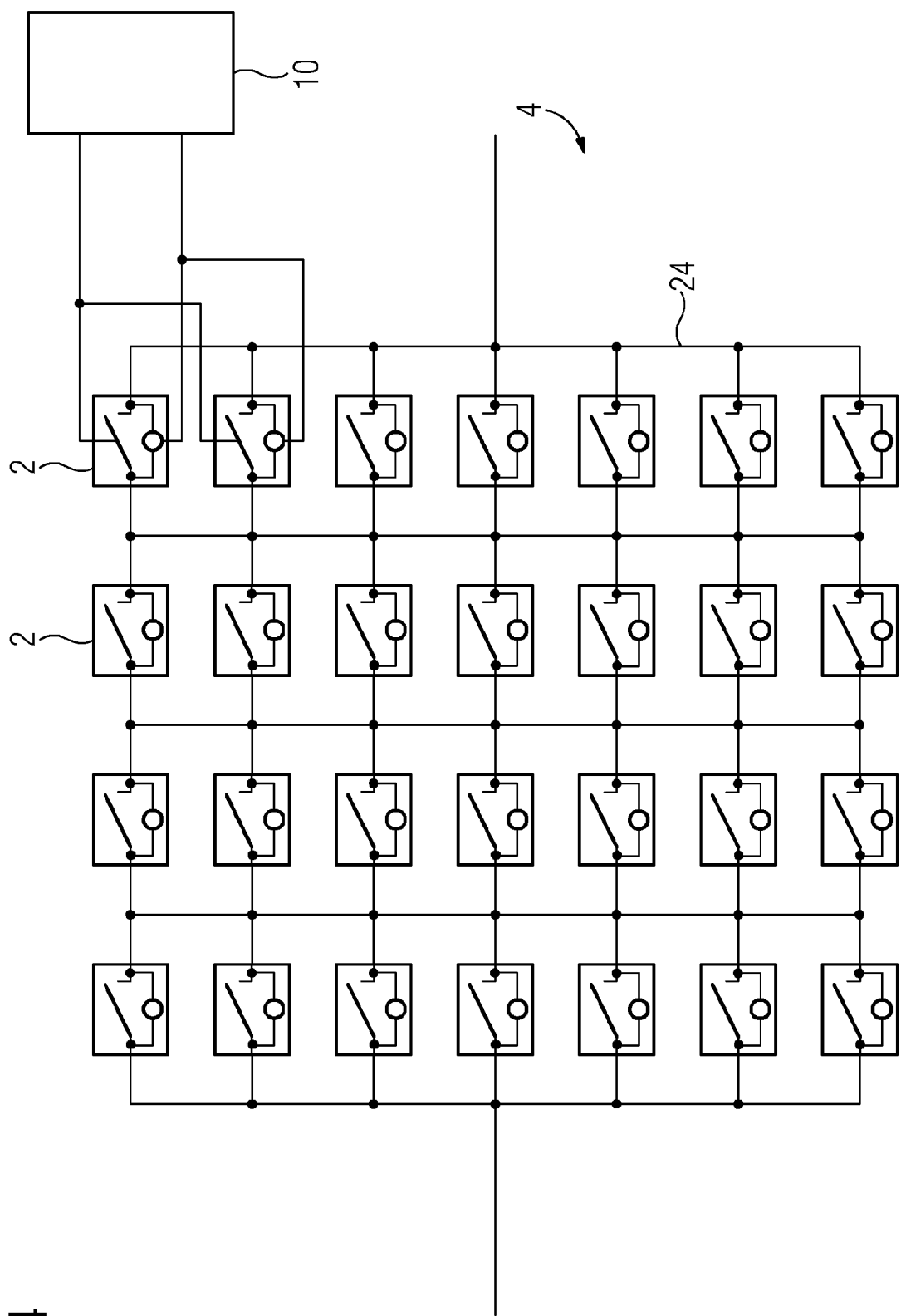

A further example shown in FIG. 4 shows a switching unit which comprises an array 24 of different switch cells 2 connected in parallel and in series. These individual switch cells 2 in the array 24 of the switching unit 4 can also be actuated by one or more actuation circuits 10, which, as described, is mounted either on the same substrate or externally. The difference between FIGS. 4 and 3 consists in the fact that the array 24 in FIG. 4 contains individual switch cells 2, which can in turn be embodied in the form of switch cells 2 as shown in FIG. 3 or FIG. 2. Such an arrangement is referred to as a switching unit.

Such a switching unit 4 can in turn be used as a switch in an inverter or in a switching device for low-voltage and medium-voltage networks.

What is claimed is:

1. A switch cell comprising:
a semiconductor switch element;
a plurality of micro-electromechanical switch elements connected in series and in parallel to form an array; and
an electronic actuation circuit;
wherein the semiconductor switch element is connected in parallel to the array and integrated together with the array on a substrate; and
in a switch-off process for the switch cell, the semiconductor switch element is switched off after the micro-electromechanical switch element is switched off.

2. The switch cell as claimed in claim 1, wherein in a switch-on process for the switch cell, the semiconductor switch element is switched on before the micro-electromechanical switch element is switched on.

3. The switch cell as claimed in claim 1 wherein the actuation circuit comprises at least one of a time-delay element or a pulse-stretching element.

4. The switch cell as claimed in claim 3, wherein the micro-electromechanical switch element and the semiconductor switch element are integrated jointly on a silicon chip.

5. A switching unit comprising a plurality of switch cells; wherein each switch cell comprises:
a semiconductor switch element;
a plurality of micro-electromechanical switch elements connected in series and in parallel to form an array; and
an electronic actuation circuit;
wherein the semiconductor switch element is connected in parallel to the array and integrated together with the array on a substrate; and
in a switch-off process for the switch cell, the semiconductor switch element is switched off after the micro-electromechanical switch element is switched off.

6. The switching unit as claimed in claim 5, wherein the plurality of switch cells is connected in a row and in parallel.

7. An inverter comprising a switching unit, the switching unit comprising a plurality of switch cells, wherein each switch cell comprises:
a semiconductor switch element;
a plurality of micro-electromechanical switch elements connected in series and in parallel to form an array; and
an electronic actuation circuit;
wherein the semiconductor switch element is connected in parallel to the array and integrated together with the array on a substrate; and
in a switch-off process for the switch cell, the semiconductor switch element is switched off after the micro-electromechanical switch element is switched off.

8. A switching device for low-voltage or medium-voltage networks comprising a switching unit comprising a plurality of switch cells;
wherein each switch cell comprises:
a semiconductor switch element;
a plurality of micro-electromechanical switch elements connected in series and in parallel to form an array; and
an electronic actuation circuit;
wherein the semiconductor switch element is connected in parallel to the array and integrated together with the array on a substrate; and
in a switch-off process for the switch cell, the semiconductor switch element is switched off after the micro-electromechanical switch element is switched off.

9. A method for operating a switch cell, the method comprising:
switching off an array of micro-electromechanical switch elements connected in parallel and series; and
after switching of the array, switching off the semiconductor switch element;
wherein the semiconductor switch element is connected in parallel to the array and integrated together with the array on a substrate; and
an electronic actuation circuit executes the switching off of the semiconductor switch element and the micro-electromechanical switch element.

10. The method as claimed in claim 9 further comprising, during a switch-on process for the switch cell, switching on the semiconductor switch element before switching on the micro-electromechanical switch element.

11. The method as claimed in claim 9, further comprising switching off the semiconductor switch element between a switch-on process and a switch-off process for the switch cell.

* * * * *